(12) United States Patent
Tishbi et al.

(10) Patent No.: US 11,842,786 B1
(45) Date of Patent: Dec. 12, 2023

(54) TRACKING OF READ VOLTAGES WHILE READING MEMORY CELLS

(71) Applicant: Apple Inc., Cupertino, CA (US)

(72) Inventors: Nir Tishbi, Kfar Saba (IL); Ilia Benkovitch, Rishon Lezion (IL); Ruby Mizrahi, Tel Mond (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/852,660

(22) Filed: Jun. 29, 2022

(51) Int. Cl.
*G11C 29/00* (2006.01)
*G11C 29/50* (2006.01)

(52) U.S. Cl.
CPC ......... *G11C 29/50004* (2013.01); *G11C 2029/5004* (2013.01)

(58) Field of Classification Search
CPC ......... G11C 29/50004; G11C 2029/5004
See application file for complete search history.

(56) References Cited

U.S. PATENT DOCUMENTS

| | | | |
|---|---|---|---|
| 8,259,506 B1 | 9/2012 | Sommer et al. | |
| 8,305,809 B2 | 11/2012 | Shen et al. | |
| 9,691,492 B1* | 6/2017 | Querbach | G11C 16/10 |
| 10,468,117 B2* | 11/2019 | Chen | G11C 29/028 |
| 10,777,284 B2 | 9/2020 | Malshe et al. | |
| 2014/0258796 A1 | 9/2014 | Ghaly et al. | |
| 2019/0172542 A1 | 6/2019 | Miladinovic | |
| 2022/0171566 A1* | 6/2022 | Kim | G11C 16/349 |

* cited by examiner

*Primary Examiner* — Christine T. Tu
(74) *Attorney, Agent, or Firm* — KLIGLER & ASSOCIATES PATENT ATTORNEYS LTD

(57) ABSTRACT

A memory controller includes an interface and a processor. The interface communicates with a plurality of memory cells. The processor produces one or more readouts by reading a group of the memory cells using one or more Read Voltages (RVs). Based on the readouts, the processor calculates for a given RV among the RVs a sample of an error signal indicative of a deviation between the given RV and an optimal RV that results in a minimal number of errors in reading the memory cells in the group. The processor applies a filter to the sample of the error signal so as to produce an updated value of the given RV, the filter includes one or more filter taps storing data related to previous samples of the error signal, and reads a second group of the memory cells using the updated value of the given RV.

22 Claims, 4 Drawing Sheets

TRACKING OF READ VOLTAGES WHILE READING MEMORY CELLS

TECHNICAL FIELD

Embodiments described herein relate generally to data storage, and particularly to methods and systems for tracking of read voltages while reading memory cells.

BACKGROUND

Various types of nonvolatile memory cells, such as Flash memory cells, are typically read by comparing storage values in the memory cells to one or more read thresholds. Various techniques for setting and adjusting read thresholds are known in the art. For example, U.S. Pat. No. 8,305,809 describes embodiments for dealing with threshold voltage change in memory devices. The embodiments include an array of memory cells and control circuitry having sense circuitry coupled to the array. The control circuitry is configured to determine changes in threshold voltages (Vts) associated with the memory cells without using a reference cell, and adjust the sense circuitry based on the determined changes and without using a reference cell.

U.S. Patent Application Publication 2014/0258796 describes an adaptive search scheme that leads to threshold voltages that have lower bit error rates over initial values. An initial reference voltage is used, and data is measured for set steps in voltage about the initial value sufficient to fit a polynomial curve. A minimum is used to determine the lowest bit error rate and corresponding optimum threshold voltage. This voltage is adopted as the new threshold voltage for reading the given data.

SUMMARY

An embodiment that is described herein provides a memory controller that includes an interface and a processor. The interface is configured to communicate with a plurality of memory cells. The processor is configured to produce one or more readouts by reading a group of the memory cells using one or more Read Voltages (RVs), and based on the readouts to calculate for a given RV among the RVs a sample of an error signal indicative of a deviation between the given RV and an optimal RV that results in a minimal number of errors in reading the memory cells in the group. The processor is further configured to apply a filter to the sample of the error signal so as to produce an updated value of the given RV, the filter includes one or more filter taps storing data related to previous samples of the error signal, and to read a second group of the memory cells using the updated value of the given RV.

In some embodiments, the processor is configured to calculate the sample of the error signal by calculating a ratio between a number of memory cells falling on a given side of the given RV and an overall number of memory cells in the group. In other embodiments, the processor is configured to calculate the sample of the error signal by calculating a difference between (i) a first number of errors associated with "0"-to-"1" bit-flips with respect to the given RV, and (ii) a second number of errors associated with "1"-to-"0" bit-flips with respect to the given RV. In yet other embodiments, the given RV is positioned between adjacent first and second threshold voltage distributions, and the processor is configured to read the memory cells in the group using first and second read thresholds positioned below and above the given RV, and to calculate the sample of the error signal by calculating a difference between first and second numbers of errors associated respectively with memory cells belonging to the first and second threshold voltage distributions and falling within a zone between the first and second read thresholds.

In an embodiment, the processor is configured to apply the filter by processing the sample of the error signal using a processing scheme including one or more discrete time integrators, and one or more gain parameters. In another embodiment, the processor is configured to preconfigure the one or more gain parameters so as to minimize a mean square value of the deviation over multiple updates of the given RV. In yet another embodiment, the processor is configured to read a data page from the memory cells in the group using first and second RVs, to generate for the first and second RVs respective first and second updated RV values, and to use the first and second updated RV values in reading subsequent data pages.

In some embodiments, the processor is configured to produce for the first and second RVs respective first and second samples of error signals, and to generate the first and second updated RV values by applying to the first and second samples respective first and second filters having different respective states. In other embodiments, the optimal RV varies across multiple groups of memory cells belonging to a common memory block, and the processor is configured to track the optimal RV by updating the value of the given RV multiple times while performing sequential reading of multiple groups of the memory cells. In yet other embodiments, the processor is configured to produce for a first RV among the multiple RVs a first updated RV value, based on first data read from the group of the memory cells, and to produce for a second RV among the multiple RVs, a second updated RV value, based on second data read from another group of the memory cells.

In an embodiment, the processor includes a hardware-implemented tracking circuit that is shared in tracking a group of multiple RVs in different groups of memory cells belonging to different planes or dies.

There is additionally provided, in accordance with an embodiment that is described herein, a method, including, in a memory controller that communicates with a plurality of memory cells, producing one or more readouts by reading a group of the memory cells using one or more Read Voltages (RVs). Based on the readouts, a sample of an error signal is calculated for a given RV among the RVs, the sample of an error signal being indicative of a deviation between the given RV and an optimal RV that results in a minimal number of errors in reading the memory cells in the group. A filter is applied to the sample of the error signal so as to produce an updated value of the given RV, the filter includes one or more filter taps storing data related to previous samples of the error signal. A second group of the memory cells is read using the updated value of the given RV.

These and other embodiments will be more fully understood from the following detailed description of the embodiments thereof, taken together with the drawings in which:

DETAILED DESCRIPTION OF EMBODIMENTS

Overview

Figure 1:
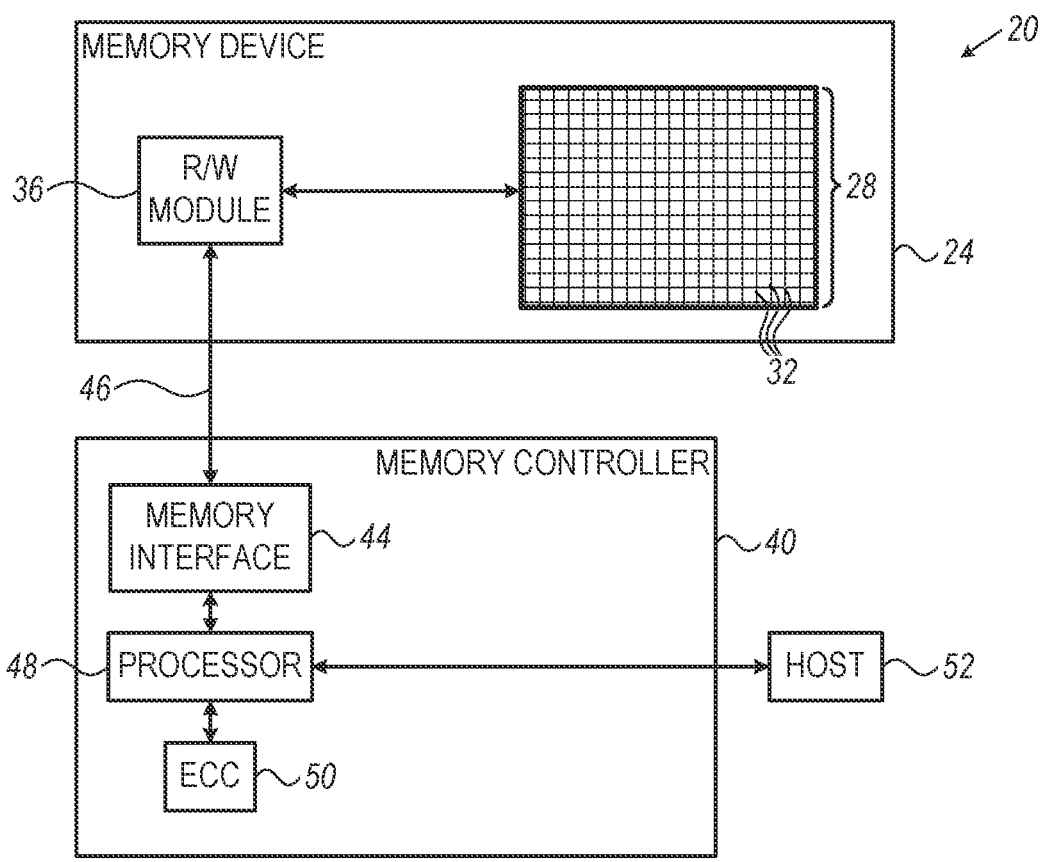
FIG. 1 is a block diagram that schematically illustrates a memory system, in accordance with an embodiment that is described herein.

Embodiments that are described herein provide methods and systems for tracking optimal positions of Read Voltages (RVs) for reliable reading of memory cells. The disclosed embodiments are applicable, for example, for tracking variations of an optimal RV in sequential reading of memory blocks.

Memory cells are typically programmed in multiple predefined nominal Programming Voltages (PVs). Due to differences among the memory cells, imperfect programming and various impairments, the threshold voltages of the memory cells are typically distributed in accordance with certain Threshold Voltage Distributions (TVDs) about the nominal PVs.

To read the stored data, the memory cells are sensed using one or more read thresholds positioned between adjacent PVs. Read thresholds that are used for reading data pages (e.g., code words) from the memory cells are referred to herein as Read Voltages (RVs). Accurate positioning of RVs and other read thresholds is crucial for reliable retrieval of the data from the memory cells.

To distinguish between adjacent TVDs, RVs are typically positioned at about mid-points between corresponding adjacent nominal PVs. For example, RVs may be set to crossover points between adjacent TVDs, which results in the minimal number of bit errors. In the present context, a RV position that results in a minimal number of readout errors is referred to herein as an "optimal RV."

The inventors discovered through field experiments that the optimal RV may vary across different groups of memory cells (e.g., WLs) in the same memory block. Moreover, even small deviations from the optimal RV may degrade readout reliability significantly. This, in turn, may result in a high rate of ECC decoding failures, and consequently to severe degradation in read throughput. Variations in the optimal RVs across WLs of a memory block may occur, for example, in three-dimensional (3D) memory devices, e.g., due to manufacture process used in such devices.

In principle, an optimal RV may be determined for some WL and used in reading other WLs. It is noted, however, that an RV that is optimal for a given WL, would typically not be optimal for other WLs (even within the same memory block). Due to RV variations, such a reading scheme would result in degraded throughput, especially when operating close to the ECC decoding capabilities. In another reading scheme, optimal RVs may be determined for each WL separately. A procedure for finding an optimal RV is, however, typically highly complex, and would degrade the throughput considerably if applied frequently.

In the disclosed embodiments, a memory controller coupled to a memory device continuously tracks the optimal RV while reading data from a memory block. The memory controller updates the RV being used so that the updated value of the RV is typically closer to the optimal RV (whose value is unknown). The memory controller may use the updated RV in reading data from memory cells belonging to one or more WLs in the same or another memory block.

Consider an embodiment of a memory controller comprising an interface and a processor. The interface communicates with a plurality of memory cells. The processor produces one or more readouts by reading a group of the memory cells using one or more Read Voltages (RVs), and based on the readouts, calculates for a given RV among the RVs a sample of an error signal indicative of a deviation between the given RV and an optimal RV that results in a minimal number of errors in reading the memory cells in the group. The controller further applies a filter to the sample of the error signal so as to produce an updated value of the given RV, wherein the filter comprises one or more filter taps storing data related to previous samples of the error signal, and reads a second group of the memory cells using the updated value of the given RV.

In the present application, several embodiments for generating the error signal are described and analyzed. In one such embodiment, the processor calculates the sample of the error signal by calculating a ratio between a number of memory cells falling on a given side of the given RV and an overall number of memory cells in the group. In another embodiment, the processor calculates the sample of the error signal by calculating a difference between (i) a first number of errors associated with "0"-to-"1" bit-flips with respect to the given RV, and (ii) a second number of errors associated with "1"-to-"0" bit-flips with respect to the given RV. In yet another embodiment, the given RV is positioned between adjacent first and second TVDs, and the processor reads the memory cells in the group using first and second read thresholds positioned below and above the given RV, and calculates the sample of the error signal by calculating a difference between first and second numbers of errors associated respectively with memory cells belonging to the first and second TVDs and falling within a zone between the first and second read thresholds.

In some embodiments, the processor is configured to apply the filter by processing the sample of the error signal using a processing scheme comprising one or more discrete time integrators, and one or more gain parameters. The processor may preconfigure the one or more gain parameters so as to minimize a mean square value of the deviation over multiple updates of the given RV.

In some embodiments, the processor updates multiple RV values of multiple respective RVs, based on data read from different respective groups of the memory cells. For example, the processor updates RV1 and RV2 for even and odd WLs, respectively.

In some embodiments, the processor comprises a hardware-implemented tracking circuit that is shared in tracking a group of multiple RVs in different groups of memory cells belonging to different planes or dies. For example, data may be read from such multiple memory blocks in parallel, but used in tracking the RVs in only one of the memory blocks at a time. Alternatively, multiple tracking circuits may be assigned for tracking RVs in multiple different planes or dies.

In some embodiments, in sequential reading, the processor tracks the optimal RV by updating the value of the given RV multiple times while reading multiple groups of the memory cells.

The disclosed embodiments are also applicable in reading data pages using multiple RVs (e.g., reading a MSB data page may require two different RVs). In such embodiments, the memory controller may track each of multiple RVs separately, by generating multiple respective samples of error signals and applying to them multiple respective filters having different respective states.

In the disclosed techniques a controller closely tracks optimal RVs while reading data from memory. The RV tracking mechanism is implemented as a closed-loop control system optimized under a MMSE criterion and requires no extra read operations. By tracking optimal RVs using the disclosed embodiments, readout reliability increases significantly with no or minimal degradation in readout throughput.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32. In the context of the present patent application, the term "memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as storage values or threshold voltages. Although the embodiments described herein mainly address threshold voltages, the methods and systems described herein may be used with any other suitable kind of storage values.

Memory system 20 stores data in memory cells 32 by programming the memory cells to assume respective memory states, which are also referred to as programming levels. The programming levels are selected from a finite set of possible levels, and each programming level corresponds to a certain nominal storage value, also referred to as a nominal Programming Voltage (PV). For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), and a 4 bit/cell MLC, also referred to as a Quad-Level Cell (QLC) device can be respectively programmed to assume one of eight possible programming levels and one of sixteen programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity). For reading a data page, the R/W module typically sets one or more read thresholds, e.g., at about mid-points between adjacent nominal programming levels, and senses the threshold voltages of the memory cells relative to the read thresholds. The R/W module can also read the storage values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

In the example of FIG. 1, memory controller 40 is coupled to a single memory device 24. In alternative embodiments, however, the memory controller may be coupled via link 46 to multiple memory devices 24, each of which comprising a separate die. Moreover, memory cells 32 may be arranged in array 28 in multiple planes. In such embodiments, the memory controller may read data from multiple planes and/or dies in parallel. In the present context the term "in parallel" means "simultaneously" or much closer in time than individual read operations.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may include any suitable type of ECC, such as, for example, Low Density Parity Check (LDPC), Reed-Solomon (RS) or Bose-Chaudhuri-Hocquenghem (BCH), can be used. In some embodiments, the ECC supported by ECC module 50 can be represented by a set of parity-check equations such as, for example, LDPC codes.

Data read from a group of memory cells may contain one or more errors. The number of errors typically increases when the read threshold used for sensing the memory cells is positioned non-optimally.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (PAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subgroup of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

Efficient Tracking of Read Voltages

Figure 2:
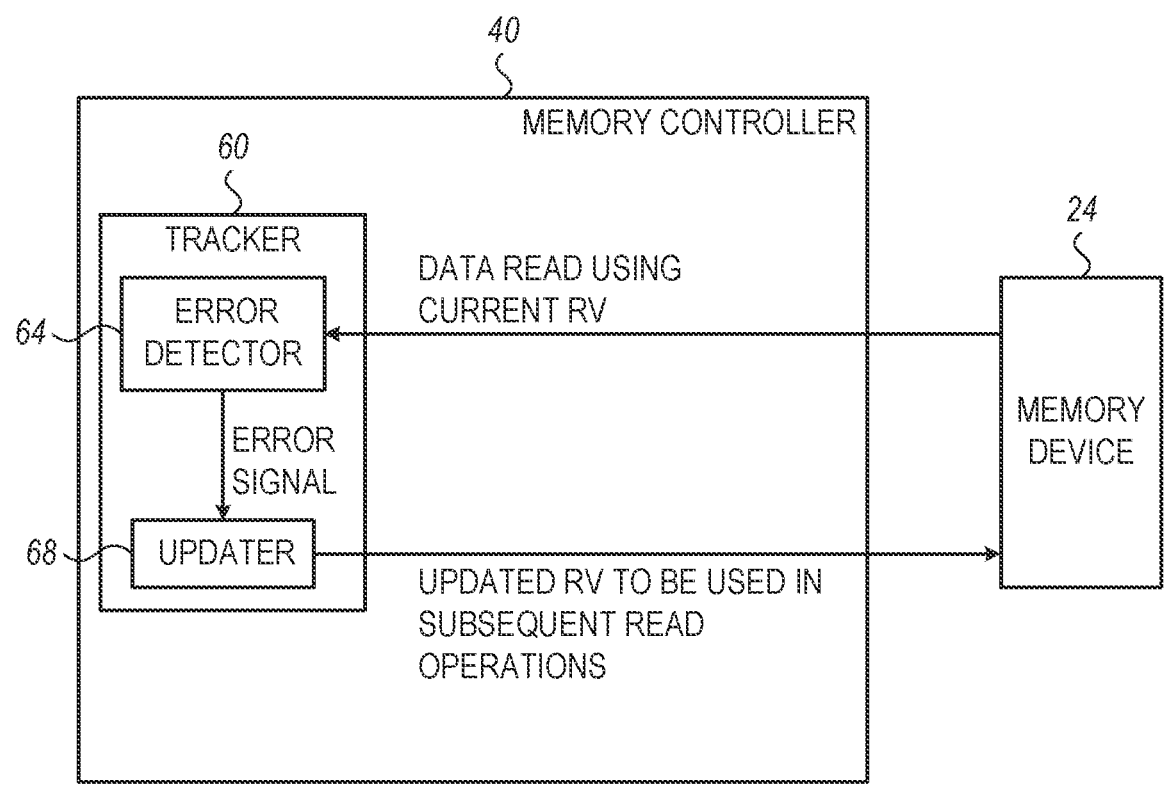
FIG. 2 is a block diagram that schematically illustrates a memory controller configured to track optimal RVs, in accordance with an embodiment that is described herein.

FIG. 2 is a block diagram that schematically illustrates memory controller 40 configured to track optimal RVs, in accordance with an embodiment that is described herein.

In describing FIG. 2, it is assumed that the functionality of memory 40 is implemented using one or more elements such as processor 48 and/or ECC 50.

In FIG. 2, memory controller 40 comprises a tracker 60 that tracks an optimal RV across WLs (or other groups of memory cells) belonging to a memory block in memory device 24. Tracker 60 comprises an error detector 64 and an updater 68. Although in the present example tracker 60 tracks a single optimal RV, in other embodiments, tracker 60 may track multiple optimal RVs, e.g., concurrently or using any suitable order or schedule scheme.

To track the optimal RV, which is typically unknown, the memory controller reads data from a group of memory cells belonging to a certain WL in the memory device. In some embodiments, the memory controller tracks the optimal RV based on the data pages having different respective bit significance values (also referred to herein as page types) read from the group of the memory cells. Alternatively, the memory controller may track the optimal RV based on one or more (but not necessarily all) of the data pages (page types) read from the same memory cells. In some embodiments the memory controller reads the data pages as part of ongoing read operations, e.g., managed by the host, and is not required to perform any extra read operations just for the purpose of RV tracking.

Error detector 64 receives data read using the current RV value, and based on this data, produces a sample of an error signal that is indicative of a deviation between the current RV value and the optimal RV. Example embodiments that may be used in implementing error detector 64 will be described and analyzed further below.

Updater 68 processes the sample of the error signal to produce an updated RV value. In some embodiments updater 68 comprises a loop filter (not shown in FIG. 2), also referred to herein simply as a "filter" for brevity.

The memory controller uses the updated RV value in subsequent read operations. For example, in some embodiments the memory controller reads data from memory cells belonging to one or more subsequent WLs in the same or different memory block using the recently updated RV value, before re-updating the RV value.

The memory controller may initiate the updating of one or more RVs at various resolutions. For example, in an embodiment, the memory controller initiates RV updating after reading each WL or after reading multiple WLs. Alternatively, the memory controller may initiate RV updating after reading one or more groups of memory cells belonging to a common WL.

In some embodiments updater 68 comprises a discrete time loop filter (also referred to as a digital filter) having any suitable topology, e.g., a Finite Impulse Response (FIR) or Infinite Impulse Response (IIR). The filter comprises multiple taps storing data related to samples of the error signal previously input to the filter. The taps of the loop filter are also referred to herein collectively as a "state" of the filter.

As noted above, the memory controller typically decodes data pages (e.g., code words) read from memory device 24 using ECC module 50. In some embodiments, upon detecting that decoding a code word that was read using the current RV has failed, the memory controller performs a RV acquisition procedure to determine the optimal RV for the group of memory cells from which that code word was read. The memory controller then re-reads the code word using the optimal RV, which is more likely to decode successfully. The memory controller further continues to track the optimal RV in subsequent read operations, as described above.

Figure 3:
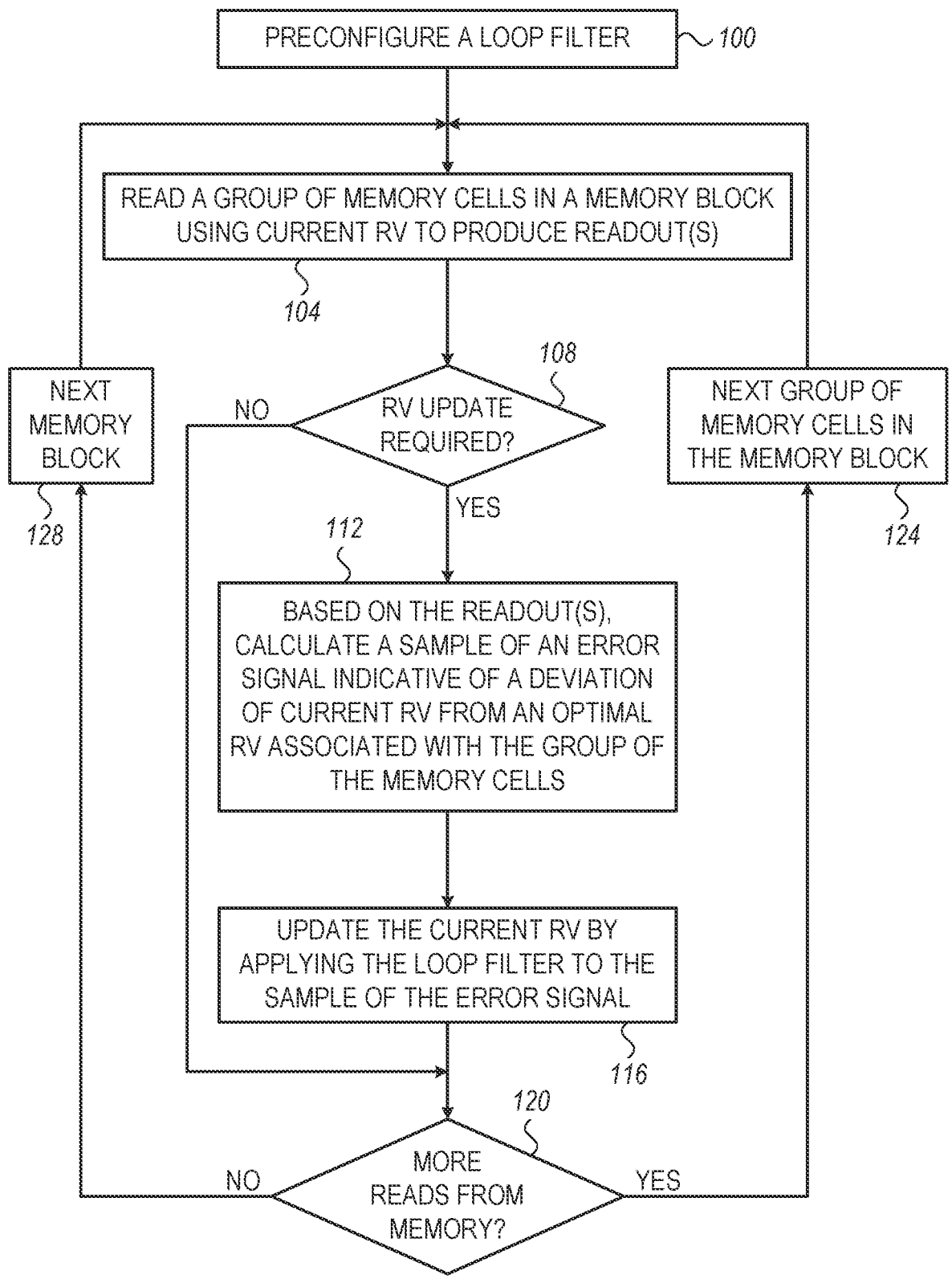
FIG. 3 is a flow chart that schematically illustrates a method for tracking an optimal RV while reading data from a memory device, in accordance with an embodiment that is described herein.

FIG. 3 is a flow chart that schematically illustrates a method for tracking an optimal RV while reading data from a memory device, in accordance with an embodiment that is described herein.

The method will be described as executed by processor 48 of memory controller 40 in FIG. 1.

The method begins at a filter configuration step 100, with processor 48 configuring a loop filter to be used (e.g., by updater 68) in tracking an optimal RV.

For a given filter topology, the processor configures filter parameters such as filter coefficients and/or one or more gain parameters. The gain parameters may be determined for optimal tracking performance, as will be described in detail further below. In some embodiments, the full configuration of the loop filter is provided in advance, in which case step 100 may be omitted.

At an input step 104, the processor reads a group of memory cells in a memory block using the current RV value, to produce one or more readouts.

At an update query step 108, the processor checks whether the current RV value needs to be updated, and if so proceeds to update the RV as described with reference to steps 112 and 116. In some embodiments, steps 112 and 116 respectively implement error detector 64 and updater 68 of tracker 60 in FIG. 2 above.

At step 108, the processor may decide whether RV update is required or not in various ways as described herein. In one embodiment, the processor decides to update the current RV value when the number of read operations performed since a previous RV update exceeds a predefined number. In another embodiment, the processor decides to update the RV value in response to detecting that the time elapsed since the previous RV update exceeds a predefined time interval. In yet another embodiment, the processor may decide to update the RV value when the rate of ECC decoding failures exceeds a predefined failure rate.

At an error estimation step 112, the processor calculates, based on the readout (s) retrieved at step 104 above, a sample of an error signal that is indicative of the deviation between the current RV value and the optimal RV value associated with the group of the memory cells from which the readout(s) were retrieved.

At an RV updating step 116, the processor updates the RV value by applying the loop filter (of updater 68) to the sample of the error signal. The loop filter outputs an updated RV value that replaces the RV value used before the update.

Following step 116, or when the processor detects at step 108 that the RV value needs no updating, the processor proceeds to a block termination step 120 to check whether there are additional read operations pending. When the outcome at step 120 is positive, the processor selects another group of memory cells in the present memory block, at a same block selection step 124. Otherwise, the processor selects a group of memory cells in another memory block, at a block selection step 128. Following each of steps 124 and 128, the processor loops back to step 104 to read the selected group of memory cells using the current (possibly updated) RV value.

By updating the RV value periodically, the processor closely tracks the optimal RV, thereby reducing the rate of ECC decoding failures. Since the disclosed RV tracking mechanism requires much less calculations by the processor than a full RV acquisition procedure, the processor may update the RV value a high rate (e.g., for each WL), with no or minimal degradation in read throughput.

Optimizing Tracking Performance Based on a Closed-Loop Control System Model

In tracking the optimal RV using tracker 60, it is desirable to retain the value of the RV value used close to the optimal RV. The difference or distance between the current RV value and the optimal RV is also referred to herein as "RV deviation." For evaluating RV tracking performance, a suitable performance measure may be defined based on RV deviation values. In general, the tracking performance depends on the configurations of error detector 64 and updater 68.

In some embodiments, a performance measure for RV tracking is derived based on Mean Square Error (MSE) formulation. With a Minimal MSE (MMSE) criterion, optimal tracking performance is achieved by minimizing a MSE-based measure over RV deviation values. Alternatively, other suitable performance measures for RV tracking can also be used.

Figure 4:
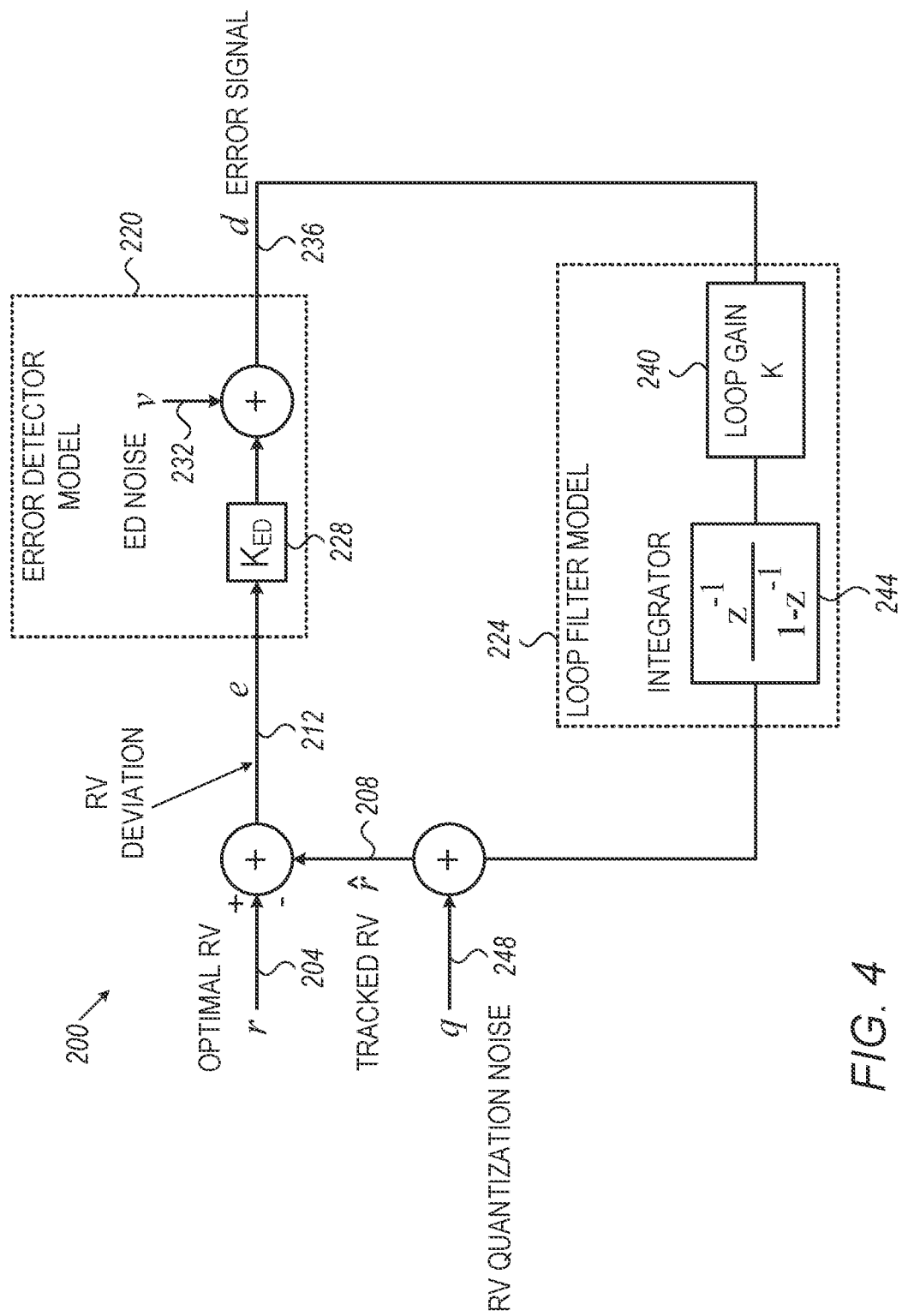
FIG. 4 is a diagram that schematically illustrates a control model of a closed-loop control system, applicable in tracking an optimal RV, in accordance with an embodiment that is described herein.

FIG. 4 is a diagram that schematically illustrates a control model 200 of a closed-loop control system, applicable in tracking an optimal RV, in accordance with an embodiment that is described herein.

In control model 200, an optimal RV 204 and a current RV value 208 are denoted r and $\hat{r}$, respectively. An RV deviation signal 212, denoted e, is defined by difference signal $e=(r-\hat{r})$. A nonzero RV deviation sample means that the current RV value differs from the optimal RV, which may result in readout errors and throughput degradation, as described above.

Control model 200 comprises an Error Detector (ED) model 220 that models error detector 64, and a loop filter model 224 that models the functionality of updater 68. The ED model comprises an ED gain parameter 228 denoted $K_{ED}$, and an additive ED noise signal 232 denoted v. The ED noise signal is modeled as a random variable having a Gaussian distribution with zero mean and variance denoted $\sigma_v^2$.

ED model 220 translates the RV deviation signal e into an error signal 236, denoted d. In accordance with ED model 220, the error signal is given by $d=e \cdot K_{ED}+V$.

In the present example, control model 200 models a first order closed-loop control system. As such, loop filter model 224 comprises a loop gain parameter 240, denoted K, and a discrete-time integrator 244. The loop filter processes a sample of error signal to produce an updated RV value 208 ($\hat{r}$).

In general, a discrete-time integrator calculates an output sample denoted y(n), by adding a previous output sample y(n−1) to the current input sample x(n). The transfer function of such a discrete-time integrator, in the Z domain, is given by $Y(z)=1/(1-Z^{-1})$. In the present model, x(n) model a sample of the error signal, and y(n) models a corresponding updated RV value. The numerator in the transfer function of integrator 244 contains a $Z^{-1}$ element for preventing races in the loop.

In the present example, RV value 208 is represented with limited precision, e.g., using b bits. In control model 200, RV quantization effect is modeled as an additive quantization noise signal 248, denoted by the symbol q. The quantization noise signal has zero mean, and variance given by $\sigma_q^2 = 2^{-2b}/12$.

Under MMSE formulation, the mean square value of the RV deviation signal MSE=E{$e^2$} is to be minimized. It can be shown that in control model 200, the mean square value is given by:

$$MSE = \frac{1}{2\pi}\int_{-\pi}^{\pi} |R(e^{j\omega})|^2 \frac{|1-e^{j\omega}|^2}{|1-(1-K_{ED}K)e^{-j\omega}|^2} d\omega + \sigma_q^2 \frac{2K_{ED}K}{1-(1-K_{ED}K)^2} + \sigma_v^2 \frac{K^2}{1-(1-K_{ED}K)^2}$$

Equation 1

In Equation 1, $R(e^{j\omega})$ denotes the Discrete-Time Fourier Transform (DTFT) of the stimulus signal r.

For a given $K_{ED}$ (which depends on the underlying error detector), and for a given stimulus signal, the MSE in Equation 1 can be minimized with respect to the loop gain parameter K. Finding the optimal K value that minimizes the MSE may be performed numerically, by evaluating the MSE in Equation 1 for multiple values of K. It can be shown that for achieving a stable control loop in control model 200, the gain parameters are required to satisfy a condition given by $0 < 2K < K_{ED}$.

Tracker 60 of FIG. 2 can be related to control model 200 by identifying the signal output by error detector 64 as the modeled error signal d (236), and further identifying the output of updater 68 as the modeled RV value r̂ (208). It is noted that the disclosed embodiments for implementing tracker 60 make no explicit use of ED model 220, and not of the quantization noise signal 248. Moreover, Tracker 60 produces the updated RV value at the output of updater 68, without explicitly calculating any RV deviation signal such as, for example, the RV deviation signal 212 modeled in FIG. 4.

Control model 200 in FIG. 4 is given by way of example, and other suitable types of control models can also be used. For example, a higher order control model in which the loop filter comprises multiple discrete-time integrators and multiple gain parameters can also be used. Further alternatively, suitable loop filters containing no integrators, or combining integrator and non-integrator elements can also be used.

Error Detector Embodiments

As noted above, the tracking performance of tracker 60 depends on the configurations of error detector 64 and updater 68. Next are described several variant embodiments that may be used in implementing error detector 64. The variant embodiments, referred to herein as ED_V1, ED_V2 and ED_V3, will be analyzed based on ED control model 220 of FIG. 4. In each of the variant embodiments, the error signal d (236) is indicative of some imbalance measure caused by the RV deviation between the current RV value and the optimal RV.

In describing the variant embodiments ED_V1, ED_V2 and ED_V3, it is assumed that error detector 64 receives one or more readouts (page types) produced by reading a group of N memory cells in some WL using one or more RVs. Each of the readouts thus containing N bits. In order to estimate the error signal for a RV of a certain page type, the memory controller separates memory cells or bits related to this RV from those of other RVs used in reading the page type, e.g., using one or more readouts of other page types read from the same group of the memory cells.

In general, the level of self-noise produced the error detector decreases with the number of bits used by the error detector for estimating the error signal. It is therefore advantageous to use the entire N bits of a readout. In other embodiments, however, only a subset of the entire N bits may be used, e.g., due to memory limitations, latency, processing time, and the like. For example, half of the bits of a code word may be used.

Variant embodiment ED_V1 is based on detecting a deviation from a nominal ratio that is expected when reading using the optimal RV, between the number of memory cells falling on a given side of the current RV value (e.g., below the RV value) and an overall number of memory cells in the group. In this case, a difference between an actual ratio and the expected nominal ratio is indicative of a deviation from the optimal RV.

Variant embodiment ED_V2, is based on detecting an imbalance between first and second numbers of errors associated respectively with "0"-to-"1" bit-flips and "1"-to-"0" bit-flips, which are expected to be equal with respect to the optimal RV. In this case, the difference between the first and second numbers of errors is indicative of a deviation from the optimal RV.

In variant embodiment ED_V3, the memory controller produces first and second readouts using respective first and second read voltages positioned below and above the current RV. When using the optimal RV, first and second ratios of memory cells whose threshold voltages fall in a zone between the first and second read thresholds, and that belong to respective adjacent TVDs, are expected to be equal. In this case, a difference between the first and second ratios is indicative of a deviation from the optimal RV.

In analyzing the performance of error detector 64, it is assumed that the TVDs corresponding to the nominal PVs are equally distributed. This assumption is, however, not mandatory. In alternative embodiments, the error detector may support TVDs that are distributed unequally, by considering possible disparities between TVDs.

Consider reading data from a group of memory cells that store the data in multiple programming levels denoted PVm, and respective distributions denoted $TVD_m$ are associated with the PVm, m=1 ... M. In the present example, each distribution $TVD_m$ is modeled as a Gaussian distribution having a mean value $\mu_m$ and variance $\sigma_m^2$. In the description that follows, adjacent distributions $TVD_{m-1}$ and $TVD_m$ are assumed to share a common variance $\sigma_m^2$, for the sake of simplicity. Similar analysis and optimizations may be carried out using adjacent TVDs modeled with different respective variances.

In analyzing the various variant embodiments of the error detector, the error signal d(m) for the $m^{th}$ RV positioned between PVm−1 and PVm is modeled in accordance with ED model 220 of FIG. 4 as:

$$d(RVm) = K_{ED}(m) \cdot \Delta T_m + v_m$$

Equation 2:

wherein $\Delta T_m$ in Equation 2 denotes the RV deviation (equivalent to a sample of error signal e in control model 200). In terms of the current and optimal RVs (denoted herein RVm and RVOm, respectively), the RV deviation is given by $\Delta T_m = (RVOm - RVm)$.

In variant embodiment ED_V1, when RVm equals RVOm, the nominal ratio of memory cells whose threshold voltages fall below RVOm is given by C(RVOm)=m/M. When RVm differs from RVOm, the actual ratio of memory cells whose threshold voltages fall below RVm, denoted C(RVm), would typically differ from C(RVOm). In variant embodiment ED_V1, the error signal can be expressed as given by:

$$d(RVm) = C(RVOm) - C(RVm) \quad \text{Equation 3}$$

It can be shown that the error signal in Equation 3 can be approximated as given by:

$$d(RVm) \approx \frac{2\exp[-(\Delta\mu_m)^2/8\sigma_m^2]}{M\sqrt{2\pi\sigma_m^2}}(\Delta T_m) + v_m \quad \text{Equation 4}$$

wherein $\Delta\mu_m = (\mu_m - \mu_{m-1})$, and the variance of the ED noise signal $v_m$ is given by:

$$\sigma_{vm}^2 = m(M-m)/(M^2 N) \quad \text{Equation 5}$$

The gain of the ED model for RVm is therefore given by:

$$K_{ED}(m) = \frac{2\exp[-(\Delta\mu_m)^2/8\sigma_m^2]}{M\sqrt{2\pi\sigma_m^2}} \quad \text{Equation 6}$$

In implementing error detector 64 using variant embodiment ED_V1, the memory controller is required to calculate the actual ratio C(RVm) for deriving a sample of the error signal using equation 3. It is noted that the memory controller can calculate the actual ratio based on raw data read, independently of whether this raw data can be successfully decoded using ECC module 50. In some embodiments, for calculating C(RVm), the memory controller counts the number of "1" bits (or "0" bits) in a readout taken using RVm.

In accordance with variant embodiment ED_V2, the error signal can be expressed as:

$$d(RVm) = \frac{(NLm - NRm)}{N} \quad \text{Equation 7}$$

In Equation 7, NLm and NRm denote respective numbers of errors contributed by $TVD_{m-1}$ and $TVD_m$. NLm and NRm represent numbers of errors associated with "0"-to-"1" bit-flips and with "1"-to-"0" bit-flips with respect to RVm.

It can be shown that the expectation of the error signal in Equation 7 is equal to the expectation of the error signal in Equation 3, and therefore the ED gain $K_{ED}(m)$ in ED_V2 is the same as in ED_V1, as given in Equation 6. It can be shown that by modeling NLm and NRm as random variables having binomial distributions and approximating the binomial distributions using Gaussian distributions, the variance of the ED noise in variant embodiment ED_V2 can be approximated as given by:

$$\sigma_{vm}^2 \approx \frac{2}{(M \cdot N)} Q\left(\frac{\Delta\mu_m}{2\sigma_m}\right) \quad \text{Equation 8}$$

It can further be shown that the noise variance in Equation 8 is smaller than the maximal noise variance (over m=1 ... M) given in Equation 5. Since the ED models in both variant embodiments ED_V1 and ED_V2 have the same error detector gain, and since the noise level in ED_V2 is lower than in ED_V1, variant embodiment ED_V2 has better tracking performance (e.g., lower MMSE) compared to variant embodiment ED_V1.

In implementing error detector 64 using variant embodiment ED_V2, the memory controller calculates number of errors NLm and NRm for deriving a sample of the error signal using equation 7. In some embodiments, the memory controller calculates NLm and NRm based on a raw readout taken at RVm, and on a successfully decoded version of that raw readout.

In accordance with variant embodiment ED_V3, in addition to reading a group of memory cells using RVm, the memory controller also reads the group of memory cells using read voltages denoted herein RLm and RRm, positioned respectively below and above RVm. The range of threshold voltages between RLm and RRm is referred to as a "zone" whose width is given by $\Delta m = RRm - RLm$.

Let CLm and CRm denote numbers of memory cells having threshold voltages in the zone between RLm and RRm, and that belong to $TVD_{m-1}$ and $TVD_m$, respectively.

The error signal in this case can be expressed as given by:

$$d(RVm) = \frac{(CLm - CRm)}{N} \quad \text{Equation 9}$$

It can be shown that the gain of the ED model in this case is given by:

$$K_{ED}(m) = \frac{2}{M\sqrt{2\pi\sigma_m^2}}\left[\exp(-\Delta L_m^2/2\sigma_m^2) - \exp(-\Delta R_m^2/2\sigma_m^2)\right] \quad \text{Equation 10}$$

wherein $\Delta L$ and $\Delta R$ are given by:

$$\Delta L_m = \left(\frac{\Delta\mu_m}{2} - \frac{\Delta m}{2}\right) \quad \text{Equation 12}$$

$$\Delta R_m = \left(\frac{\Delta\mu_m}{2} + \frac{\Delta m}{2}\right) \quad \text{Equation 13}$$

It can further be shown that in variant embodiment ED_V3, the variance of the ED noise signal in ED model 220 is given by:

$$\sigma_{vm}^2 = \frac{2}{(M \cdot N)}\left[Q\left(\frac{\Delta L_m}{\sigma_m}\right) - Q\left(\frac{\Delta R_m}{\sigma_m}\right)\right] \quad \text{Equation 14}$$

In implementing error detector 64 using variant embodiment ED_V3, the memory controller calculates numbers of cells CLm and CRm for deriving a sample of the error signal using equation 9.

In some embodiments, the memory controller calculates CLm and CRm based on a raw readout taken at RVm, and on the decoded version of that raw readout (assuming successful ECC decoding).

The analysis of the various variant embodiments above, refers to tracking the $m^{th}$ RV by tracker 60. In other embodiments, however, tracker 60 may track multiple RVs. To this end, in some embodiments the memory controller produces multiple readouts corresponding to multiple respective RV values. Based on the multiple readouts, tracker 60 updates multiple RV values that the memory controller uses in subsequent read operations.

In some embodiments, tracker 60 tracks different optimal RVs independently from one another. In such embodiments, the tracker updates each RV using a dedicated control loop. In an embodiment of this sort, the tracker produces first and second samples of error signals corresponding to first and second RVs among the multiple RVs and updates the first and second RVs by applying to the first and second samples separate respective first and second filters having different respective states.

In an embodiment, the memory controller reads data from the memory cells using multiple RVs. In this embodiment, tracker 60 produces two or more updated RV values for respective two or more different RVs among the multiple RVs, based on data read from two or more different respective groups of the memory cells.

In some embodiments, tracker 60 is implemented in hardware. In such embodiments, tracker 60 may be shared in tracking a group of multiple RVs in different groups of memory cells belonging to different planes or dies. For example, even though the tracker (or memory controller) may read data from multiple memory blocks in parallel, the tracker tracks the RVs in only one of the memory blocks at a time. With reference to FIG. 2, in some embodiments, error detector 64 calculates multiple samples of error signals. Moreover, updater 68 holds separate states of multiple respective loop filters and may calculate multiple updated RV values by applying the loop filters to respective error signals.

The embodiments described above are given by way of example. Alternatively, other suitable embodiments can also be used. For example, although in the embodiments above, TVDs are modeled as Gaussian distributions, other suitable types of distribution models can also be used. For example, the TVDs may be modeled as mixtures of Gaussian distributions.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
   an interface, configured to communicate with a plurality of memory cells; and
   a processor, configured to:
   produce one or more readouts by reading a group of the memory cells using one or more Read Voltages (RVs);
   based on the readouts, calculate for a given RV among the RVs a sample of an error signal indicative of a deviation between the given RV and an optimal RV that results in a minimal number of errors in reading the memory cells in the group;
   apply a filter to the sample of the error signal so as to produce an updated value of the given RV, wherein the filter comprises one or more filter taps storing data related to previous samples of the error signal; and
   read a second group of the memory cells using the updated value of the given RV.

2. The memory controller according to claim 1, wherein the processor is configured to calculate the sample of the error signal by calculating a ratio between a number of memory cells falling on a given side of the given RV and an overall number of memory cells in the group.

3. The memory controller according to claim 1, wherein the processor is configured to calculate the sample of the error signal by calculating a difference between (i) a first number of errors associated with "0"-to-"1" bit-flips with respect to the given RV, and (ii) a second number of errors associated with "1"-to-"0" bit-flips with respect to the given RV.

4. The memory controller according to claim 1, wherein the given RV is positioned between adjacent first and second threshold voltage distributions, and wherein the processor is configured to read the memory cells in the group using first and second read thresholds positioned below and above the given RV, and to calculate the sample of the error signal by calculating a difference between first and second numbers of errors associated respectively with memory cells belonging to the first and second threshold voltage distributions and falling within a zone between the first and second read thresholds.

5. The memory controller according to claim 1, wherein the processor is configured to apply the filter by processing the sample of the error signal using a processing scheme comprising one or more discrete time integrators, and one or more gain parameters.

6. The memory controller according to claim 5, wherein the processor is configured to preconfigure the one or more gain parameters so as to minimize a mean square value of the deviation over multiple updates of the given RV.

7. The memory controller according to claim 1, wherein the processor is configured to read a data page from the memory cells in the group using first and second RVs, to generate for the first and second RVs respective first and second updated RV values, and to use the first and second updated RV values in reading subsequent data pages.

8. The memory controller according to claim 7, wherein the processor is configured to produce for the first and second RVs respective first and second samples of error signals, and to generate the first and second updated RV values by applying to the first and second samples respective first and second filters having different respective states.

9. The memory controller according to claim 1, wherein the optimal RV varies across multiple groups of memory cells belonging to a common memory block, and wherein the processor is configured to track the optimal RV by updating the value of the given RV multiple times while performing sequential reading of multiple groups of the memory cells.

10. The memory controller according to claim 1, wherein the processor is configured to produce for a first RV among the multiple RVs a first updated RV value, based on first data read from the group of the memory cells, and to produce for a second RV among the multiple RVs, a second updated RV value, based on second data read from another group of the memory cells.

11. The memory controller according to claim 1, wherein the processor comprises a hardware-implemented tracking circuit that is shared in tracking a group of multiple RVs in different groups of memory cells belonging to different planes or dies.

12. A method, comprising:
   in a memory controller that communicates with a plurality of memory cells,
   producing one or more readouts by reading a group of the memory cells using one or more Read Voltages (RVs);

based on the readouts, calculating for a given RV among the RVs a sample of an error signal indicative of a deviation between the given RV and an optimal RV that results in a minimal number of errors in reading the memory cells in the group;

applying a filter to the sample of the error signal so as to produce an updated value of the given RV, wherein the filter comprises one or more filter taps storing data related to previous samples of the error signal; and reading a second group of the memory cells using the updated value of the given RV.

13. The method according to claim 12, wherein calculating the sample of the error signal comprises calculating a ratio between a number of memory cells falling on a given side of the given RV and an overall number of memory cells in the group.

14. The method according to claim 12, wherein calculating the sample of the error signal comprises calculating a difference between (i) a first number of errors associated with "0"-to-"1" bit-flips with respect to the given RV, and (ii) a second number of errors associated with "1"-to-"0" bit-flips with respect to the given RV.

15. The method according to claim 12, wherein the given RV is positioned between adjacent first and second threshold voltage distributions, and wherein calculating the sample of the error signal comprises reading the memory cells in the group using first and second read thresholds positioned below and above the given RV, and calculating a difference between first and second numbers of errors associated respectively with memory cells belonging to the first and second threshold voltage distributions and falling within a zone between the first and second read thresholds.

16. The method according to claim 12, wherein applying the filter comprises processing the sample of the error signal using a processing scheme comprising one or more discrete time integrators, and one or more gain parameters.

17. The method according to claim 16, and comprising preconfiguring the one or more gain parameters so as to minimize a mean square value of the deviation over multiple updates of the given RV.

18. The method according to claim 12, and comprising reading a data page from the memory cells in the group using first and second RVs, generating for the first and second RVs respective first and second updated RV values, and using the first and second updated RV values in reading subsequent data pages.

19. The method according to claim 18, wherein generating the updated RV values comprises producing for the first and second RVs respective first and second samples of error signals, and generating the first and second updated RV values by applying to the first and second samples respective first and second filters having different respective states.

20. The method according to claim 12, wherein the optimal RV varies across multiple groups of memory cells belonging to a common memory block, and comprising track the optimal RV by updating the value of the given RV multiple times while performing sequential reading of multiple groups of the memory cells.

21. The method according to claim 12, and comprising producing for a first RV among the multiple RVs a first updated RV value, based on first data read from the group of the memory cells, and producing for a second RV among the multiple RVs, a second updated RV value, based on second data read from another group of the memory cells.

22. The method according to claim 12, wherein the memory controller comprises a hardware-implemented tracking circuit that is shared in tracking a group of multiple RVs in different groups of memory cells belonging to different planes or dies.

* * * * *